US008339141B2

(12) United States Patent
Gray et al.

(10) Patent No.: US 8,339,141 B2
(45) Date of Patent: Dec. 25, 2012

(54) METHOD AND APPARATUS FOR LOCATING A FAULT IN AN ELECTRICAL CONDUCTOR, WITH INTERFERENCE COMPENSATION

(75) Inventors: Patrick Gray, Zapfendorf (DE); Hubert Schlapp, Ebern (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 520 days.

(21) Appl. No.: 12/657,824

(22) Filed: Jan. 27, 2010

(65) Prior Publication Data

US 2010/0211348 A1 Aug. 19, 2010

(30) Foreign Application Priority Data

Jan. 27, 2009 (DE) ........................ 10 2009 007 382

(51) Int. Cl.
*G01R 31/02* (2006.01)

(52) U.S. Cl. ...................................................... 324/537

(58) Field of Classification Search ........................ None
See application file for complete search history.

(56) References Cited

U.S. PATENT DOCUMENTS 6,437,578 B1 * 8/2002 Gumm ......................... 324/533

FOREIGN PATENT DOCUMENTS

EP 0148674 A1 * 7/1985
EP 1411361 A1 * 4/2004
EP 2211190 A1 * 7/2010
WO WO 03040736 A1 * 5/2003

OTHER PUBLICATIONS

Non-parametric calibration of a time domain reflectometer, Instrumentation and Measurement Technology Conference, 1994. IEEE pp. 114-117 vol. 1, May 10-12, 1994.*

* cited by examiner

*Primary Examiner* — Melissa Koval
*Assistant Examiner* — Julio C Diaz Perez
(74) *Attorney, Agent, or Firm* — W. F. Fasse

(57) ABSTRACT

A voltage pulse is transmitted into a test object, and returned reflection pulses are evaluated to determine the location of a fault in the test object. The return signal includes a reflection from the fault and undesired interfering reflection pulses, which are removed or compensated-out from the return signal to produce a corrected pulse diagram. A circuit arrangement for this includes a bi-directional coupler, a separation filter, a measured signal detection circuit with two input channels, a memory storing a database, a computer processor, and a measured signal evaluation unit. A method in this regard includes a first step of measuring the input impedance of the test object, and a second step of measuring the return signal pulses, transforming the return signal to the frequency domain, compensating the frequency domain data to remove interference, transforming the data back to the time domain, and representing or evaluating the pulse diagram.

10 Claims, 3 Drawing Sheets

METHOD AND APPARATUS FOR LOCATING A FAULT IN AN ELECTRICAL CONDUCTOR, WITH INTERFERENCE COMPENSATION

PRIORITY CLAIM

This application is based on and claims the priority under 35 U.S.C. §119 of German Patent Application 10 2009 007 382.5, filed on Jan. 27, 2009, the entire disclosure of which is incorporated herein by reference.

FIELD OF THE INVENTION

The invention relates to a method and an apparatus for providing interference compensation when locating a fault in a test object including an electrical conductor, such as an electrical cable or electrical line, using a length or location determination based on an electrical pulse reflection transit time measurement.

BACKGROUND INFORMATION

It is generally known to determine the location of a fault in an electrical conductor of a test object by emitting an electrical voltage pulse from an electrical pulse voltage source, and transmitting that pulse into the test object, i.e. the electrical conductor such as an electrical line or a cable. If there is a fault in the conductor, such as a complete or partial break, this causes a local change in the characteristic impedance of the conductor being tested or monitored. This particular impedance step will lead to a partial reflection of the transmitted voltage pulse depending on the severity of the impedance change. In case of a complete break of the conductor, the voltage pulse will be totally reflected at the location of the fault. If the fault is characterized as only partial, then the extent of how much of the incident voltage pulse is reflected depends on the extent of change in impedance the fault poses to the cable. If the change of impedance at the location of the fault is too small to be detected, then an additional high voltage source can be optionally applied at the input of the electrical conductor so as to charge the cable being tested in order to surpass the breakthrough voltage of the intermittent or partial fault and thereby achieve a controlled spark-over or arcing at the fault location. The low impedance of the arc causes a total reflection of the incident pulse at the location of the former undetectable intermittent fault, hence reflecting the incident voltage pulse completely. The optional high voltage source for fault ignition is further combined with extra testing equipment including a pulse echo meter or time domain impulse reflectometer as well as a measurement value detection circuit for detecting and evaluating one or more echos or reflected pulses that are received by the pulse echo meter at the input of the electrical conductor. The reflection is recorded by the time domain impulse reflectometer, in order to measure the time difference between the point of time at which the voltage pulse is emitted and the instant at which the reflected pulse arrives at the input of the electrical conductor. Then the distance from the input end of the electrical conductor to the location of the fault is determined based on the time difference measured before and the propagation velocity of the cable. This distance provides the location of the fault in the conductor.

Typically, the pulse echo meter or measuring device is integrated with the other equipment on a testing cart or instrument car, and is connected via a testing lead, e.g. a connecting cable, with the test object that is to be tested. The testing lead may have a length of up to 50 m, depending on the particular situation.

The characteristic wave impedance of the testing lead generally does not correspond to the input impedance of the test object, so that an additional interfering reflection of the input signal typically arises at the location of the connection interface of the testing lead to the test object. This additional interfering reflection appears in the pulse diagram of the reflection pulses received by the test equipment, but this interfering reflection provides no useful information for the user of the system, and also makes it more difficult to properly interpret or evaluate the measurements due to multiple reflections between this interfering reflection pulse and following impedance discontinuities.

Furthermore, the conventionally known equipment further includes a separation filter arranged in the propagation path of the pulse, e.g. connected between the test equipment and the test object. This separation filter serves to decouple the time domain measuring system and the pulse source from the optional high voltage source, yet to couple the pulses of the time domain measuring system into the test object. Due to its transfer function, this separation filter causes additional interference, or particularly a falsification of the pulse diagram, i.e. the train or sequence of pulses received back from the test object. In that regard, due to the natural self-resonance of the separation filter, a low frequency oscillation is superimposed on the pulse diagram. This makes it more difficult to determine the exact point of time of the base of a reflected pulse, so that an error arises in the transit time determination of the respective pulse.

SUMMARY OF THE INVENTION

In view of the above, it is an object of the invention to provide a method and an apparatus to simplify and improve the evaluation of measured data regarding reflection pulses or echos that are measured by a time domain reflectometer in carrying out a process of locating a fault in an electrical conductor. Furthermore, the invention aims to remove, compensate or correct the interfering influences that arise within the measured value detection equipment or between that equipment and the actual test object being tested. Thereby, the invention aims to improve or increase the likelihood of correct recognition and location of conductor faults along the conductor, and especially such faults located in the close range of the measurement location. The invention further aims to avoid or overcome the disadvantages of the prior art, and to achieve additional advantages, as apparent from the present specification. The attainment of these objects is, however, not a required limitation of the presently claimed invention.

The above objects have been achieved in a method according to the present invention, for the compensation of interfering influences between the test equipment and the test object in the locating of a fault in a test object such as an electrical line or cable by means of a length determination through a pulse reflection evaluation method based on the transit time of a transmitted electrical pulse of a pulse source that causes a spark-over or arc with a low resistance impedance at the fault location. The test object is connected with a pulse reflectometer via a testing lead and a separation filter. The method involves the following steps. The impedance of the test object is measured. A time domain reflection measurement is carried out with separation of the transmitted (forward) and reflected (return) signals, i.e. the transmitted electrical pulse and the returned echo or reflection pulses, through a directional coupler that acts bi-directionally. Then, the data of the impedance measurement and of the forward and return signals are processed in a processor unit. A complex reflection factor is determined by separating the forward and return signals, whereby the measured signals are transformed into the frequency domain by a numerical implementation of a Fourier transformation. By carrying out a calibration in the frequency domain, the complex reflection factor is freed of interfering influences of the testing lead and the separation filter. That produces corrected data, which are preferably transformed back to the time domain and then provided to the measured value evaluation circuit or pulse echo measuring device.

The above objects have further been achieved according to the invention in an apparatus that is generally for carrying out the inventive method. The inventive apparatus includes an electrical pulse generator or source connected to a test lead via a switch arrangement, a bi-directional coupler, and a separation filter. The switch arrangement selectively connects to or bypasses the bi-directional coupler, which serves to separate the forward and return signals. A measured value detection circuit having two separate channels separately receives the forward and return signals. A computer processor unit is provided as an evaluation element for determining the complex reflection factor through the two separate channels of the measured value detection circuit, whereby the signals are transformed into the frequency domain using a numerical implementation of the Fourier transformation and/or by means of a calibration in the frequency domain the signals are freed of interfering influences of the testing lead and the separation filter, and then the resulting signal information or data is provided to the measured value evaluation circuit or pulse echo measuring device.

By the above measures, the invention removes or compensates the interfering influences of redundant echo information and signal noise, and improves the evaluatability of the signal. Furthermore, the invention prevents or avoids erroneous interpretations that could otherwise lead to incorrect conclusions about the test object, such as incorrect conclusions about the existence, location and/or number of faults in the electrical conductor as the test object. Furthermore, due to the improved evaluatability of the pulse diagrams, with a reduced amount of extraneous signal information, a quicker evaluation and interpretation of the measurement results are possible.

It is further preferably provided according to the invention, that a memory or storage device is connected to the processor unit, and stores a database of previously determined pulse diagrams. Particularly, stored pulse diagrams were determined by measurements of various different standard test objects having various different discrete resistances, with known input impedances of these standardized test objects. The resulting standardized pulse diagrams stored in the database in the memory can then be used for the evaluation and interpretation of the actual test pulse diagrams that are produced when actually testing test objects such as electrical conductors to determine the location of faults therein.

According to a further preferred embodiment feature of the invention, an advantageous arrangement includes a two port gate or network element through which the influences of the separation filter and the testing lead are combined for the subsequent evaluation.

BRIEF DESCRIPTION OF THE DRAWINGS

In order that the invention may be clearly understood, it will now be described in further detail in connection with an example embodiment thereof, with reference to the accompanying drawings, wherein.

DETAILED DESCRIPTION OF A PREFERRED EXAMPLE EMBODIMENT AND BEST MODE OF THE INVENTION

Figure 1:
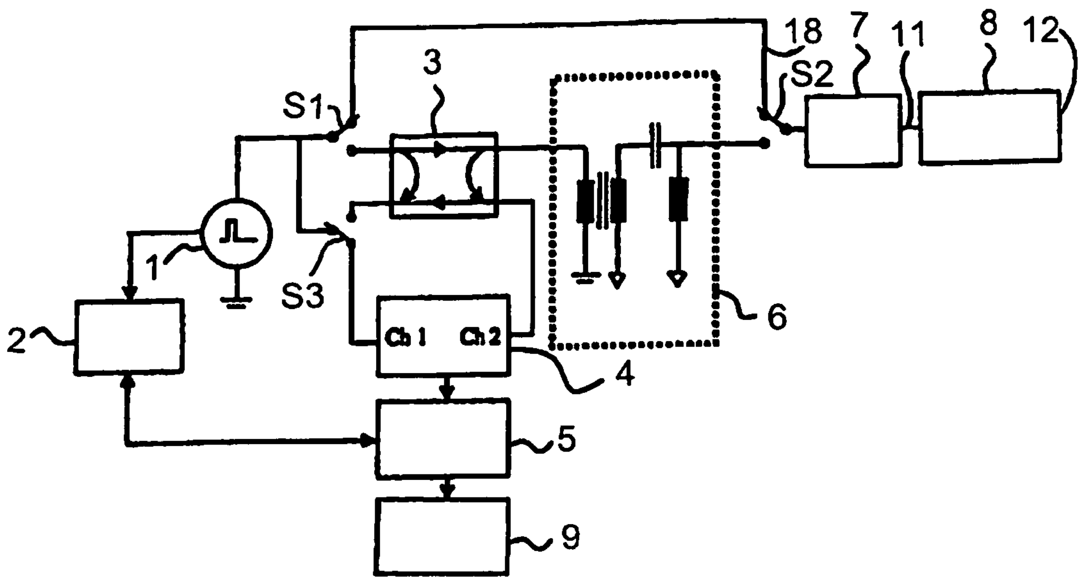
FIG. 1 is a schematic circuit diagram of a circuit arrangement for directionally coupling, filtering, detecting and evaluating forward and return signals for a pulse reflection evaluation method.

FIG. 1 shows a schematic block circuit diagram of a circuit arrangement for testing a test object 8, for example an electrical conductor such as an electrical cable having a fault therein, in order to determine the location of the fault. To carry out such locating of the fault, the circuit arrangement emits a voltage pulse that is transmitted into the test object cable 8. The transmitted voltage pulse is reflected by the fault or by the low impedance of the arc which is ignited by the optional high voltage source at the location of the intermittent fault. The reflected pulse travels back along the cable 8 to the testing circuit arrangement. The received return echo or reflection pulse signal is then detected and evaluated in the circuit arrangement, in order to determine the location of the fault. The circuit arrangement is connected to the test object cable 8 by a testing lead 7 that is connected at an interface 11 to the test object cable 8. The distant end of the test object cable 8 is open-circuited, i.e. forms an open circuit end 12.

The testing circuit arrangement includes a voltage pulse generator or source 1, a bi-directional coupler 3, and a separation filter 6, as well as a switch arrangement including three switches S1, S2 and S3, for selectively coupling the pulse signal source 1 to the testing lead 7 through the bi-directional coupler 3 and the separation filter 6, or bypassing the bi-directional coupler 3 and the separation filter 6 to connect the pulse signal source 1 directly to the testing lead 7. In the illustrated switching position, switches S1 and S2 are switched so as to bypass the coupler 3 and the filter 6, and instead to connect the pulse signal source 1 directly to the testing lead 7. The switch S3 is switched to connect the pulse signal source 1 and the testing lead 7 directly to the first channel Ch1 of a two-channel measured signal detection circuit 4. In the other switching position, the switches S1 and S2 connect the pulse signal source 1 in series through the bi-directional coupler 3 and the separation filter 6 to the testing lead 7, and the switch S3 connects the first channel Ch1 of the measured signal detection circuit 4 to a forward signal output of the coupler 3, while the second channel Ch2 of the measured signal detection circuit 4 remains permanently connected to a return signal output of the coupler 3.

The circuit arrangement further includes an arithmetic unit or computer processor unit 5 that is connected to the output of the measured signal detection circuit 4, and is further connected bi-directionally to a storage device or memory 2 that stores a database of previously determined example pulse diagrams, as will be explained further below. The computer processor unit 5 carries out the compensation or removal of interference from the received signal according to the present invention, as will also be discussed in detail below. The received signal, which has been compensated or freed of interfering signal pulses according to the invention, is passed to a measured signal evaluation unit or pulse echo measuring device 9 to carry out the identification and locating of the fault in the test cable 8.

The operation of the circuit arrangement will now be explained in further detail. The bi-directional coupler 3 is a central element of the circuit arrangement. When connected in-circuit by the switches S1, S2 and S3, the coupler 3 splits or separates the signals passing through it into a forward signal and a return signal, and respectively outputs corresponding forward and return signal components to the first channel Ch1 and second channel Ch2 of the measured signal detection circuit 4. Particularly, a portion of the forward signal including the testing pulse emitted by the pulse source 1 is separated by the coupler 3 and coupled into the first channel Ch1 of the measured signal detection circuit 4, while the majority of the forward signal emitted power is coupled by the coupler 3 through the separation filter 6 to the testing lead 7, and from there to the test object, i.e. the test cable 8. Furthermore, the reflected return signal coming back from the test object cable 8 and the testing lead 7 through the separation filter 6 is coupled through the bi-directional coupler 3 into the second channel Ch2 of the measured signal detection circuit 4. As will be explained below, the coupler 3 also typically allows some unintended cross-coupling of the return signal to the first channel Ch1 of the measured signal detection circuit 4. As discussed above, the separation filter serves to couple the pulses bi-directionally between the circuit arrangement and the test cable, while decoupling or separating the high voltage power supply from the pulse voltage source. As also discussed above, the reflected return signal coming from the testing lead 7 and test cable 8 back to the circuit arrangement includes a reflection pulse that is reflected from the fault in the cable 8, but also a reflection from the open-circuit end 12 of the cable 8, as well as a reflection from the interface 11 between the testing lead 7 and the test cable 8, and further interference due to an oscillation of the filter 6 superimposed on the reflected pulses.

The separation or splitting of the signal into a forward signal and a return signal through the bi-directional coupler 3 makes it possible to calculate a complex reflection factor $r_m$, if the measured signal is transformed into the frequency domain by a numerical implementation of a Fourier transformation:

$$r_m = \frac{U_r(f)}{U_i(f)}$$

Then, the complex reflection factor $r_m$ is compensated according to the invention, to free it of the interfering influences of the separation filter 6 and the testing lead 7 as discussed above, through the use of a one-port calibration method. Such a one-port calibration is generally known in high frequency technology, as a standardized measure for calibrating network analyzers and to compensate errors that are caused by feed lines or supply leads and the measured value detection circuit.

Further according to the invention, in the present example embodiment, the interfering influences of the separation filter 6 and of the testing lead 7 or the interface transition between the testing lead 7 and the test cable 8 are combined with one another in a two-port error processing device embodied in the bi-directional coupler 3 and the two-channel measured signal detection circuit 4. This allows the complex reflection factor $r_m$ to be determined and then freed of the interfering influences in the frequency domain through the inventive calibration process.

Figure 2:
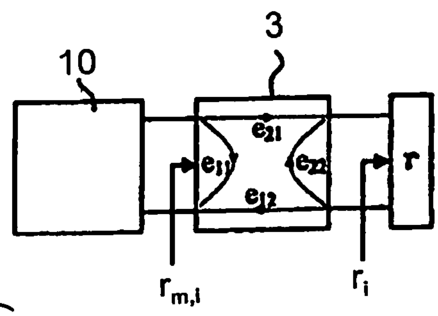
FIG. 2 is a schematic circuit diagram of a simple circuit arrangement for explaining a calculation of the error terms in the detected return signal.

The inventive calibration process will now be further explained in connection with the simplified schematic arrangement shown in FIG. 2. The signal source is now represented schematically by the signal source block 10 connected to the bi-directional coupler 3, to carry out the measurement of the reflection factor. The test object r, representing the test cable 8 and the testing lead 7 for example, shall be evaluated and characterized as to its reflected return signal behavior. However, the two-port error evaluation device falsifies the measurement with the scattering or dispersion parameters $e_{11}$, $e_{21}$, $e_{12}$ and $e_{22}$ representing the four coupling pathways through the bi-directional coupler 3 as represented in FIG. 2. Thus, instead of the desired true error-free reflection factor $r_i$, one actually measures the error-burdened reflection factor $r_{m,i}$:

$$r_{m,i} = e_{11} + \frac{e_{21}e_{12}r_i}{1 - e_{22}r_i}$$

By transposing or reconfiguring the equation, one obtains the following linear expression that is dependent on three unknown variables:

$$r_{m,i}=e_{11}+e_{22}r_ir_{m,i}-\Delta E r_i$$

wherein $$\Delta E=e_{11}e_{22}-e_{21}e_{12}$$

In order to solve the equation with three unknown variables, it is necessary to use three known results. Namely, for example, if three known standardized test objects are respectively connected to the output of the error-burdened two-port device, one after another, for carrying out three evaluations of these three known standard test objects respectively, then one obtains a completely solvable equation system of three equations with three unknown variables based on three known solutions. In this regard, it is suggested to use a short circuit, an open circuit, and a matched termination with the same matched characteristic wave impedance as the supply lead, as the three respective standardized test objects. This gives the following solvable equation system:

$$\begin{pmatrix} r_{m,1} \\ r_{m,2} \\ r_{m,3} \end{pmatrix} = \begin{bmatrix} 1 & r_1 r_{m,1} & -r_1 \\ 1 & r_2 r_{m,2} & -r_2 \\ 1 & r_3 r_{m,3} & -r_3 \end{bmatrix} \begin{pmatrix} e_{11} \\ e_{22} \\ \Delta E \end{pmatrix}$$

Using the abovementioned ideal standards of a short circuit, an open circuit, and a matched termination respectively as standard test objects to give standardized reflection factors $r_1$, $r_2$ and $r_3$, the reflection factors will be known to have the following values: $r_1$ (short circuit)=−1, $r_2$ (open circuit)=1, and $r_3$ (matched termination)=0. By plugging these known values into the above equation system, with the respective measured values $r_{m,1}$, $r_{m,2}$ and $r_{m,3}$ the solution of the equation system gives the values for $e_{11}$, $e_{22}$ and ΔE.

Upon solving the equation system, the error factors are solved or determined to be:

$$e_{11} = r_{m,3}$$

$$e_{22} = \frac{r_{m,1} + r_{m,2} - 2r_{m,3}}{r_{m,2} - r_{m,1}}$$

$$\Delta E = r_{m,3} - r_{m,2} + r_{m,2}\frac{r_{m,1} + r_{m,2} - 2r_{m,3}}{r_{m,2} - r_{m,1}}$$

With the above information, all further actual measured values $r_m$ can be corrected with the following equation, and thereby the two-port error evaluation device can be compensated with respect to the interfering influences of the testing lead 7 and the separation filter 6.

$$r = \frac{e_{11} - r_m}{\Delta E - e_{22} r_m}$$

Next, the reflection factor r present in the frequency domain is transformed back into the time domain, in order to then obtain a corrected pulse diagram in the time domain from the corrected or compensated reflection factor.

The above described one-port calibration alone corrects the influence of the separation filter 6 in the pulse diagram, but the reflection of the impedance discontinuity at the transition or connection interface 11 from the testing lead 7 to the test object cable 8 is still present, despite the one-port calibration. In this regard, the one-port calibration can be used to suppress this reflection, by calibrating with respect to the input impedance of the test object cable 8 rather than with the characteristic wave impedance of the testing lead 7. Thereby the impedance discontinuity at the interface 11 between the testing lead 7 and the test object cable 8 is interpreted as a systematic fault and is compensated by the correction factors in the compensation process. The reflection from the interface 11 is thus no longer present in the resulting pulse diagram.

In principle, the inventive method is divided into two distinct steps. In the first step, the input impedance of the test object cable 8 is measured. In the second step thereafter, the actual locating of the fault is carried out using a pulse echo measurement as discussed above. This pulse echo measurement is finally corrected or compensated as discussed above in the evaluation in the computer processor unit 5 using the information about the input impedance of the test object cable 8 as acquired in the first step.

For carrying out the measurement of the input impedance of the test object cable 8, the switches S1, S2 and S3 of the switch arrangement are positioned in the illustrated switch configuration. Namely, the respective individual switches S1, S2 and S3 are switched to the illustrated switch positions, and thus bypass or bridge-over the bi-directional coupler 3 and the separation filter 6 through a bypass line 18. Thereby the pulse signal source 1 is connected directly via the bypass line 18 to the testing lead 7 and thus the test object cable 8. Also, the first channel Ch1 of the measured signal detection circuit 4 is connected directly through switch S3 to the bypass line 18 connecting the pulse signal source 1 and the testing lead 7. Thus, the first channel Ch1 directly receives both the input pulse signal and the return signal reflected from the testing lead 7 and the test object cable 8. In this step, because the separation filter 6 and the bi-directional coupler 3 are bypassed through the switches S1 and S2, and the pulse source 1 is connected directly to the testing lead 7 and thereby the test object cable 8, the pulse source 1 must supply a voltage step or discontinuity with a moderate output voltage, so as not to overdrive the first channel Ch1 of the measured signal detection circuit 4, or the components connected to the output.

Figure 3:
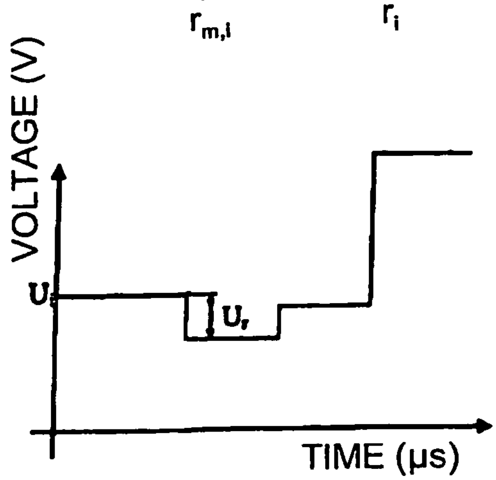
FIG. 3 is a graph of voltage (e.g. in volts) relative to time (e.g. in microseconds), representing a measured voltage diagram with a discontinuous or stepped voltage progression during a measurement of input impedance.

FIG. 3 schematically illustrates a resulting voltage measurement at the first input channel Ch1 of the measured signal detection circuit 4 in the above described input impedance measurement step. From the measured progression or course of the voltage, the input impedance of the first impedance step or discontinuity is calculated using the following formula:

$$Z_{in} = Z_0\left(\frac{1 + \frac{U_r}{U_i}}{1 - \frac{U_r}{U_i}}\right)$$

With this information regarding the value of the input impedance, a corresponding data set is selected and read out of the database in the memory 2. This memory 2 stores a database of plural previously determined pulse diagrams dependent on the adjusted pulse width and the connected input impedance. These plural pulse diagrams are determined as known samples by measurements carried out for the calibration before the actual testing operation of the device for testing and evaluating a test object such as the test object cable 8. Particularly, the plural sample pulse diagrams are previously determined using various different discrete resistances connected to the distal end of the testing lead 7. These several discrete resistances represent models of possible different input impedances of any desired test object 8 that is to be tested and evaluated. Furthermore, before carrying out an actual test measurement, additional measurements are carried out with a short-circuited end of the testing lead 7 and with an open-circuited end of the testing lead 7, and the measured values for these two known sample cases are also stored in the memory 2 as sample data sets of the database. After the sample database is populated, then the actual pulse echo measurements are carried out for testing test objects, and the data sets in the database are appropriately selected and used for calculating the correction factors in the computer processor unit 5 as discussed above.

In the second step of the method, the actual pulse echo measurement is carried out for testing a desired test object such as the test object cable 8. For this purpose in the second step, the switches S1, S2 and S3 are each switched-over to the opposite switch position relative to the positions illustrated in FIG. 1. Thus, the pulse signal source 1 is connected to the input of the bi-directional coupler 3, the output of the separation filter 6 is connected to the testing lead 7, and the first input channel Ch1 of the measured signal detection circuit 4 is connected to the forward input signal coupling output of the bi-directional coupler 3. Then, in this switching state, the pulse signal source 1 emits a pulse through the bi-directional coupler 3, the separation filter 6 and the testing lead 7 into the test object cable 8. A portion of the pulse power of the transmitted pulse is coupled out of the bi-directional coupler 3 into the first input channel Ch1 of the measured signal detection circuit 4, where this partial pulse signal is digitized. Most of the power of the input signal pulse, however, is coupled to the test object cable 8, where reflection pulses are directed back through the bi-directional coupler 3 into the second input channel Ch2 of the measured signal detection circuit 4.

Then there follows the so-called one-port calibration in the frequency domain. For that, the previously measured pulse diagrams that were stored in the memory 2 are called-up and read-out as corresponding pulse progressions for known sample cases, and these pulse progressions as well as the associated transmitted pulse measurements are transformed into the frequency domain. Then the complex reflection factors $r_m$ are calculated, and with the aid of those factor values the one-port calibration is carried out. Namely, the correction factors are calculated on the basis of the data sets of the known sample cases, and particularly the short-circuit measurement and the open-circuit measurement, as well as any other pertinent data sets that are read out of the database in the memory 2. The correction factors determined in this manner are then used to correct or compensate, in the frequency domain, the data set of the present test object that is being manipulated, i.e. corrected or compensated. Then the corrected or compensated data in the frequency domain are transformed back into the time domain, whereupon the corrected data can be represented in a pulse diagram in the time domain by the pulse echo measuring device or measured signal evaluation unit 9 in the typical manner, except that the produced pulse diagram has now been freed of the interfering influences of the filter 6, the testing lead 7, and the discontinuity or interface 11 between the testing lead 7 and the test object cable 8. It should be understood that the term “pulse diagram” herein may involve a visual representation of the pertinent signal pulse train in a diagram on a display screen or a plotter or printout, but alternatively does not require a visually represented “diagram” but rather merely a data set of the necessary data for characterizing the pertinent signal pulse train. The pulse diagram or the pulse data set may be visually interpreted or may be evaluated by the inventive circuit arrangement to determine the location of the fault in the test object.

Figure 4:
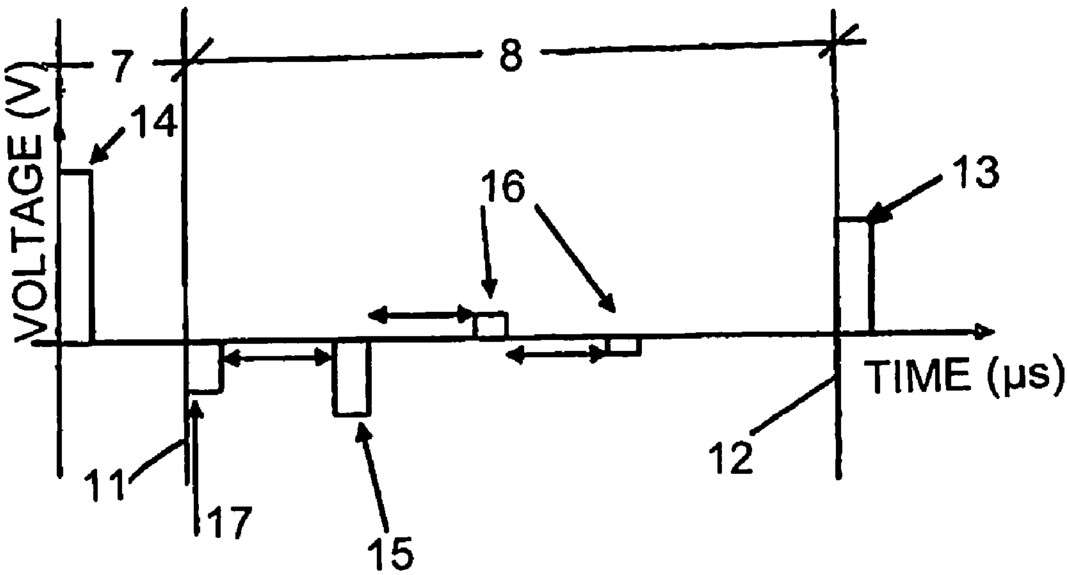
FIG. 4 is a schematic graph or diagram of voltage (e.g. in volts) relative to time (e.g. in microseconds), representing a received pulse diagram of an electrical conductor cable having a fault therein, whereby the pulse diagram is shown according to the prior art without the inventive processing.
Figure 5:
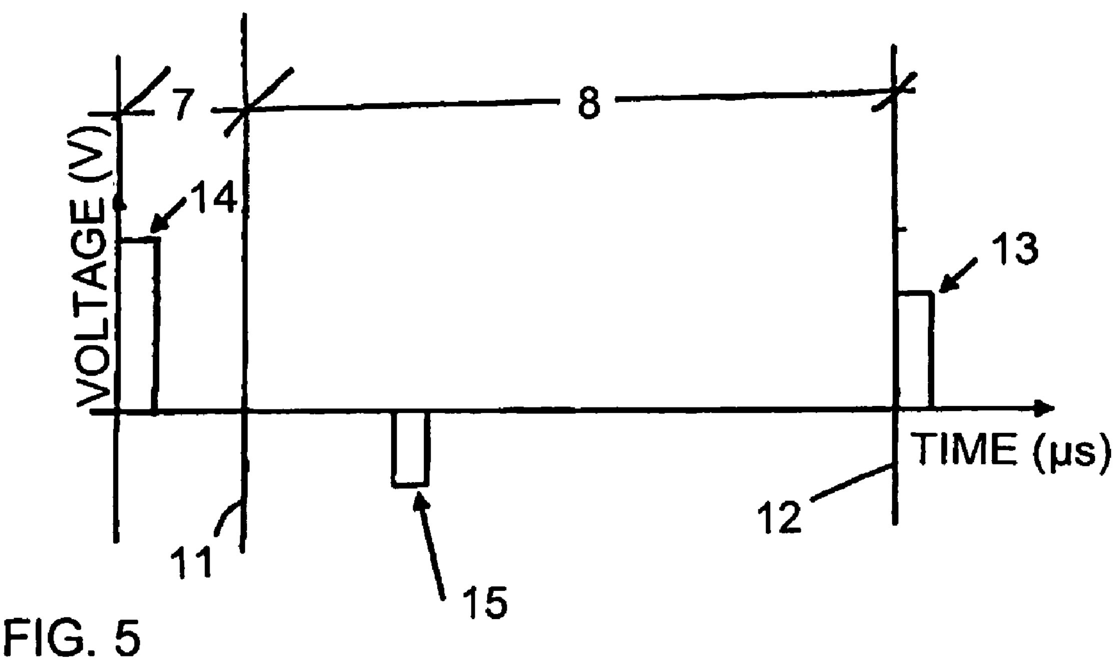
FIG. 5 is a schematic diagram similar to that of FIG. 4, but showing the pulse diagram that results with the inventive processing.
Figure 6:
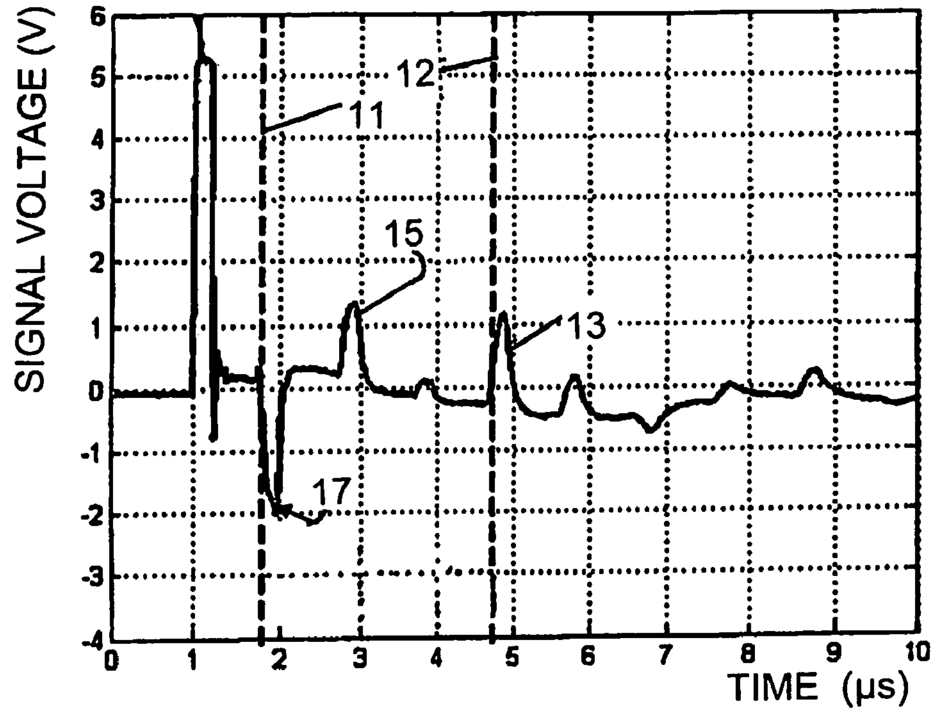
FIG. 6 is a measured value diagram of the return signal voltage (in volts) relative to time (in microseconds), of the return signal as actually measured by the pulse measuring device according to the prior art in conformance with FIG. 4.
Figure 7:
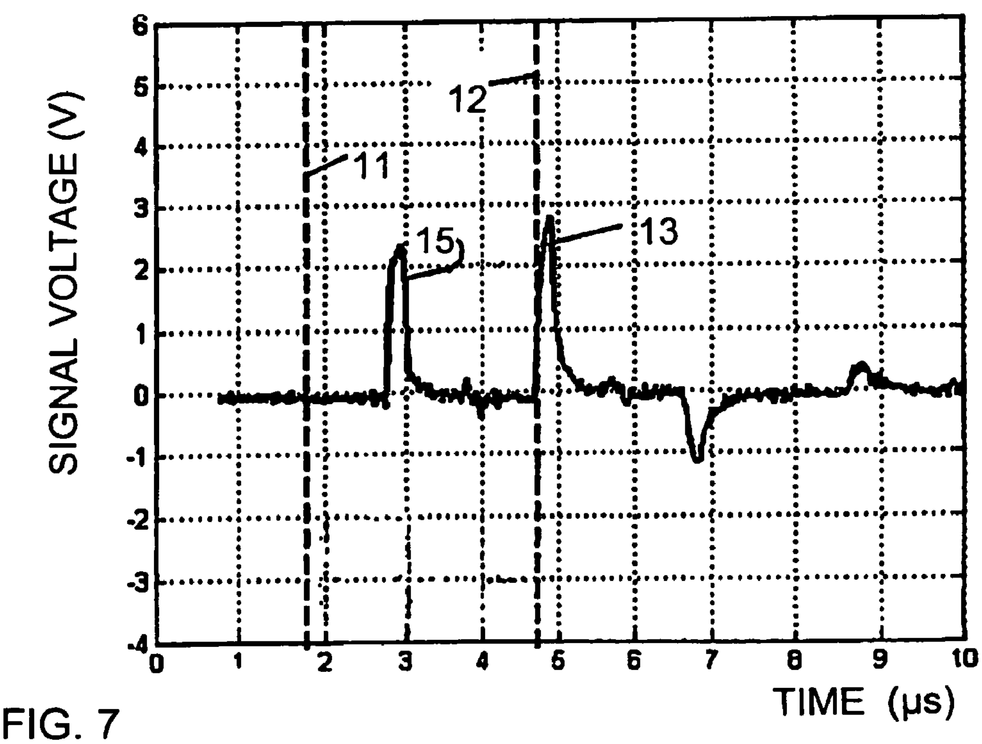
FIG. 7 is a diagram similar to that of FIG. 6, but showing the return signal as processed according to the invention in conformance with FIG. 5.

FIG. 6 represents a measured pulse signal and FIG. 4 represents a corresponding schematic pulse diagram as determined with the testing method according to the prior art. On the other hand, FIG. 7 represents a measured pulse signal and FIG. 5 represents a corresponding schematic pulse diagram of measured signal data that has been processed and corrected or compensated according to the inventive method using the inventive circuit arrangement. The connection interface 11 between the testing lead 7 and the test object cable 8 is illustrated as a reference plane 11. The open-circuited end 12 of the test object cable 8 is similarly illustrated as a reference plane 12. The emitted signal pulse 14 is transmitted into the testing lead 7 and from there into the test object cable 8. It can be seen that the interface or reference plane 11 between the testing lead 7 and the test object cable 8 generates an undesired interfering reflection pulse 17, and the open-circuited end of the test object cable 8 at the reference plane 12 generates an undesired interfering reflection pulse 13. Additional interfering reflection pulses 16 are caused by other discontinuities or variations of the cable. These interfering pulses make it more difficult to recognize and evaluate the reflection pulse 15 that is generated by the fault in the test object cable 8 that is being evaluated. By comparing FIG. 7 with FIG. 6 and comparing FIG. 5 with FIG. 4, it can be seen that the inventive method and circuit arrangement have removed or compensated-out several different undesired interfering reflection pulses, making it easier to recognize and evaluate especially the reflection pulse 15 of the cable fault that is under investigation and is to be located within the test object cable 8.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An apparatus for locating an electrical fault in an electrical test object, comprising:

an electrical pulse signal source;

a testing lead adapted to be connected at a connection interface to an input of the test object;

a bi-directional coupler having a forward signal input, a forward signal output, a first coupling output and a second coupling output;

a separation filter having a first terminal and a second terminal;

a measured signal detection circuit having a first channel input, and having a second channel input connected to said second coupling output of said bi-directional coupler, and having an output;

a switching arrangement connected and switchable so as to selectively connect said pulse signal source in series through said forward signal input and said forward signal output of said bi-directional coupler and said first and second terminals of said separation filter to said testing lead, and so as to selectively connect said first channel input of said measured signal detection circuit to said first coupling output of said bi-directional coupler;

a processor unit having a processor input connected to said output of said measured signal detection circuit, and having a processor output, wherein said processor unit is programmed and adapted to carry out a numerical implementation of a Fourier transformation to transform a time domain signal in the time domain as received at said processor input to a frequency domain signal in the frequency domain, and to compensate the frequency domain signal in the frequency domain so as to remove therefrom interference pulses originating from said testing lead, said connection interface and/or said separation filter so as to produce a compensated frequency domain signal, and to transform the compensated frequency domain signal from the frequency domain to the time domain so as to produce a compensated time domain signal at said processor output; and a measured signal evaluation unit having an input connected to said output of said processor unit.

2. The apparatus according to claim 1, wherein said measured signal evaluation unit comprises a pulse echo measuring device adapted to measure or represent a transit time from a time at which a test pulse is emitted by said pulse signal source to a time at which a reflection pulse is received, wherein the reflection pulse arises as a reflection of the test pulse at the electrical fault in the test object.

3. The apparatus according to claim 2, wherein said pulse echo measuring device is adapted to represent the transit time in a pulse diagram of signal voltage versus time.

4. The apparatus according to claim 1, wherein said switching arrangement is further switchable to selectively disconnect said bi-directional coupler and said separation filter from said pulse signal source and said testing lead, and instead to connect said pulse signal source directly to said testing lead through a bypass line bypassing said bi-directional coupler and said separation filter.

5. The apparatus according to claim 4, wherein said switching arrangement comprises a first switch connected to said pulse signal source and switchable between said bypass line and said forward signal input of said bi-directional coupler, a second switch connected to said testing lead and switchable between said bypass line and said forward signal output of said bi-directional coupler, and a third switch connected to said first channel input of said measured signal detection circuit and switchable between said pulse signal source and said first coupling output of said bi-directional coupler.

6. The apparatus according to claim 1, wherein said bi-directional coupler is constructed and adapted to couple to said first coupling output a first portion of a test pulse received at said forward signal input, and to couple to said forward signal output a second portion of the test pulse, and to couple to said first coupling output a first portion of a reflection pulse received at said forward signal output, and to couple to said second coupling output a second portion of the reflection pulse.

7. The apparatus according to claim 1, further comprising a memory connected to said processor unit, wherein said memory stores a database comprising plural standard pulse diagrams that were previously measured using said apparatus with said test lead respectively individually successively connected to plural discrete resistances having known input impedance values as standardized test objects.

8. The apparatus according to claim 7, wherein said database stored in said memory includes at least a first said standard pulse diagram determined with said discrete resistance being a short-circuit, a second said standard pulse diagram determined with said discrete resistance being an open-circuit, and a third said standard pulse diagram determined with said discrete resistance being a matched termination having a characteristic wave impedance matched to said testing lead.

9. The apparatus according to claim 1, wherein said bi-directional coupler and said measured signal detection circuit having said first and second channel inputs together form a two-port interference combining device adapted to combine interfering signal influences originating from said separation filter and from said testing lead including said connection interface.

10. A method of locating an electrical fault in an electrical test object, comprising the steps:

connecting to said test object, through a testing lead, test equipment including a pulse signal source, a bi-directional coupler, a separation filter, a measured signal detection circuit, a processor unit, and a measured signal evaluation unit;

emitting a first test pulse from said pulse signal source through said testing lead to said test object, and analyzing in said test equipment a first return signal returned from said test object to determine a measured impedance value of said test object;

emitting a second test pulse from said pulse signal source through said testing lead to said test object, and receiving in said test equipment from said test object a second return signal including a fault reflection pulse of said second test pulse reflected from said electrical fault in said test object and interference originating from at least one of said separation filter, said testing lead, and a connection interface between said testing lead and said test object;

separating said second test pulse and said second return signal through said bi-directional coupler;

processing data from said measured impedance value, said second test pulse and said second return signal in said processor unit, including carrying out a numerical implementation of a Fourier transformation to transform at least said data from said second test pulse into the frequency domain, and determining a complex reflection factor from said separated second test pulse and second return signal, and removing at least some of said interference by compensating said data from said second test pulse in the frequency domain so as to produce corrected frequency domain data, and transforming said corrected frequency domain data from the frequency domain to the time domain so as to produce corrected time domain data; and providing said corrected time domain data to said measured signal evaluation unit, wherein the physical location of said electrical fault in said test object can be determined from said corrected time domain data.

* * * * *